(12) United States Patent
Manto et al.

(10) Patent No.: US 8,849,595 B2
(45) Date of Patent: Sep. 30, 2014

(54) SYSTEM AND METHOD FOR PROVIDING CERTIFIABLE ELECTROMAGNETIC PULSE AND RFI PROTECTION THROUGH MASS-PRODUCED SHIELDED CONTAINERS AND ROOMS

(76) Inventors: Charles L. Manto, Cumberland, MD (US); Joseph R. Child, Mineral, VA (US)

( * ) Notice: Subject to any disclaimer, the term of this patent is extended or adjusted under 35 U.S.C. 154(b) by 1630 days.

(21) Appl. No.: 11/553,555

(22) Filed: Oct. 27, 2006

(65) Prior Publication Data

US 2007/0105445 A1    May 10, 2007

Related U.S. Application Data

(60) Provisional application No. 60/730,395, filed on Oct. 27, 2005.

(51) Int. Cl.
*H01R 13/66* (2006.01)
(52) U.S. Cl.
USPC .......................................................... 702/57
(58) Field of Classification Search
USPC ............................................................ 702/57
See application file for complete search history.

(56) References Cited

U.S. PATENT DOCUMENTS

| 4,890,083 A | 12/1989 | Trenker et al. |
| 6,098,891 A | 8/2000 | Guthery et al. |
| 6,812,707 B2 | 11/2004 | Yonezawa et al. |
| 2007/0038402 A1* | 2/2007 | Zhang ........................... 702/117 |

OTHER PUBLICATIONS

Design Considerations in Building Shielded Enclosures, Praveen Pothapragada Equipto Electronics Corporation, Reprinted from COTS Journal Jan. 2004, p. 1-5.*
Department of Defense, Interface Standard, MIL-STD-461, Requirements for the Control of Electromagnetic Interference Characteristics of Subsystems and Equipment, p. 1-253, Jan. 11, 1993.*
B.D. Mottahed et al., "A Review of Research in Materials, Modeling . . . ", Polymer-Plastics Technology and Engineering, vol. 34, No. 2, Mar. 1995, pp. 271-346.
Supplemental Partial European Search Report No. EP06846175, dated Jan. 31, 2011, 2 pgs.

* cited by examiner

*Primary Examiner* — Tung S Lau
(74) *Attorney, Agent, or Firm* — Greenberg Traurig, LLP

(57) ABSTRACT

Disclosed are a system and method for providing certifiable shielded cabinets and rooms, or pods, to protect devices, equipment and people from electromagnetic interference such as electromagnetic pulse, and directed energy attack. The method simulates the separate electric and magnetic shield requirements and capabilities of each type of materials, simulating them separately and together to form a combined set of materials layered for an enhanced electromagnetic shield that is lighter weight and less expensive. Further disclosed is a system and method for SCADA, RFID, and OID monitoring and controls to enable initial and ongoing testing and control.

16 Claims, 15 Drawing Sheets

SYSTEM AND METHOD FOR PROVIDING CERTIFIABLE ELECTROMAGNETIC PULSE AND RFI PROTECTION THROUGH MASS-PRODUCED SHIELDED CONTAINERS AND ROOMS

This is a non-provisional patent application claiming priority from U.S. Provisional Patent Application Ser. No. 60/730,395, filed Oct. 27, 2005, which is hereby incorporated by reference in its entirety.

This application includes material which is subject to copyright protection. The copyright owner has no objection to the facsimile reproduction by anyone of the patent disclosure, as it appears in the Patent and Trademark Office files or records, but otherwise reserves all copyright rights whatsoever.

FIELD OF THE INVENTION

The present invention relates in general to the field of computing, controls based on integrated circuits, and voice and data communications, and in particular to a novel system for providing certifiable shielded cabinets and rooms (or pods) to protect devices, equipment and people from electromagnetic interference such as electromagnetic pulse, and directed energy attack.

BACKGROUND OF THE INVENTION

Since the Cold War, scientists and engineers have discovered the complex effects of electromagnetic and microwave pulse, particularly high altitude electromagnetic pulse, including the destruction of sensitive integrated circuits that form the foundation of modern electronic controls, computers, telecommunications equipment and power transmission. The proliferation of multiple methods to create disruptive electromagnetic pulse, their relative low cost compared to the orders of magnitude greater damage they would cause, and the potentially broad geographic impact of these weapons beyond a primary target area creates the need for broad societal infrastructure and equipment protection. Furthermore, the proliferation of directed energy weapons of different types also requires protection of individuals working with equipment so that the equipment or personnel performing the tasks can be protected. Similar effects can be experienced through unusually powerful solar flares and storms.

However, most of the shielding techniques borne out of research and development for military applications during the Cold War do not provide a practical and cost effective and light weight method for shielding computer and telecommunications networks or electronic controls for non-military applications including mobile communications networks.

A review of the literature shows that the industry standards for shielding usually recommend the use of a single material such as steel plates. Steel is useful since it provides protection against electrical and magnetic fields and has a number of useful military attributes including strength and blast protection. However, it is costly and heavy. There are many applications in buildings that may not be able to be sufficiently retrofitted or in mobile applications where significantly less weighty materials are needed.

Furthermore, the current approach to shielding is primarily done through custom design and building, which makes it very difficult to quickly protect a substantial amount of national critical infrastructure and business infrastructure.

It is known in the industry that testing of proposed systems is required to verify the capability of EMP shielded systems and that different sizes, shapes and complexity require different testing methods and standards. For widespread adoption and fast deployment of mass-produced equipment, test results need to be embedded into the system to demonstrate and verify successfully tested equipment in such a way that on-going verification and maintenance can be accomplished. There is also confusion about what constitutes various electromagnetic interference threats and doubt about what would constitute adequate protection. While the confusion and doubt could hamper the acceptance of a mass-produced product in the market, they could be minimized by demonstrating that test requirements are met. It is also known that shielded systems are often compromised after installation by the creation of new apertures allowing electromagnetic interference into the shielded areas. Therefore, there is a need to provide on-going automated testing of the shields to ensure continued shielding viability.

In addition, the development of increasingly powerful circuitry using substantially more power has produced the side effect of creating more heat that needs to be transferred away from the electronics so that the equipment can be operated at a cooler temperature required for equipment safety and efficiency. Prior shielding techniques for equipment fail to take this additional cooling requirement into account.

OBJECTS AND SUMMARY OF THE INVENTION

It is an object of the invention to provide alternative materials that are lighter in weight and more cost efficient to deploy as effective shields.

It is a further object of the invention to provide supportable affirmations for prospective protective shielding and devices, especially if mass-produced.

It is a further object of the invention to provide mass-producable shielding systems such as containers, racks, and small rooms in vehicles or fixed facilities that can meet the needs of a majority of users.

It is a further object of the invention to provide an improved apparatus and integrated shielding system that meets needs for protection from electromagnetic pulse, including high altitude electronic magnetic pulse, RFI, attack from directed energy weapons, or unusual natural events such as extreme solar flares, that is lighter weight, affordable, certifiable, monitorable and controllable.

In certain embodiments, the invention provides identifiable inspection chips that would be certified to have withstood a certain level of EMP test pulses and capable of providing on-going testing. Preferably, these chips, such as radio frequency identification (RFID) chips optical identification (OID) chips, are built into the shielding systems, and may also serve supervisory control and data acquisition (SCADA) purposes complemented by built-in SCADA chips, hardware and software. OID chips and optical SCADA devices can be designed to be immune from electromagnetic interference. SCADA devices embedded into the shielding systems make it possible to control heat by either increasing cooling activities as power is available, or scale down heat producing activities when cooling capabilities reach their peak ability to cool down the shielded equipment. The invention in certain embodiments may further include test chips that can show EMI impact upon visual inspection.

The invention in certain embodiments uses simulation techniques to assess the different magnetic and electronic shielding capabilities separately in order to discover novel combinations of materials that would provide superior overall shielding effectiveness at a lesser weight and provides an example in thin layers of aluminum and a weave of steel threads.

BRIEF DESCRIPTION OF THE DRAWINGS

The foregoing and other objects, features, and advantages of the invention will be apparent from the following more particular description of preferred embodiments as illustrated in the accompanying drawings, in which reference characters refer to the same parts throughout the various views. The drawings are not necessarily to scale, emphasis instead being placed upon illustrating principles of the invention.

DETAILED DESCRIPTION OF THE PREFERRED EMBODIMENT

Reference will now be made in detail to the preferred embodiments of the present invention, examples of which are illustrated in the accompanying drawings.

Figure 1:
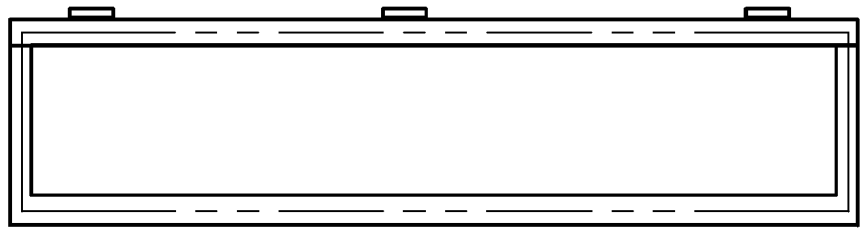
FIG. 1 a front cross-sectional view of a shielded hinged container in accordance with an embodiment of the invention.

In one embodiment, the invention provides a novel solution to the problem of providing electromagnetic and microwave pulse protection through the provision of mass-produced shielded enclosures and rooms. FIG. 1 shows an enclosure designed for EMP shielded storage and transportation. The enclosure includes shielding such as aluminum plated surfaces, with steel thread weaves sandwiched between them. Gaskets may be provided around the lid. Test chips may be provided on or in the enclosure. Sizes may range from briefcase-sized to larger shipping container. The enclosure may be coated as necessary with protective polymers or steel threaded tapes.

Figure 2:
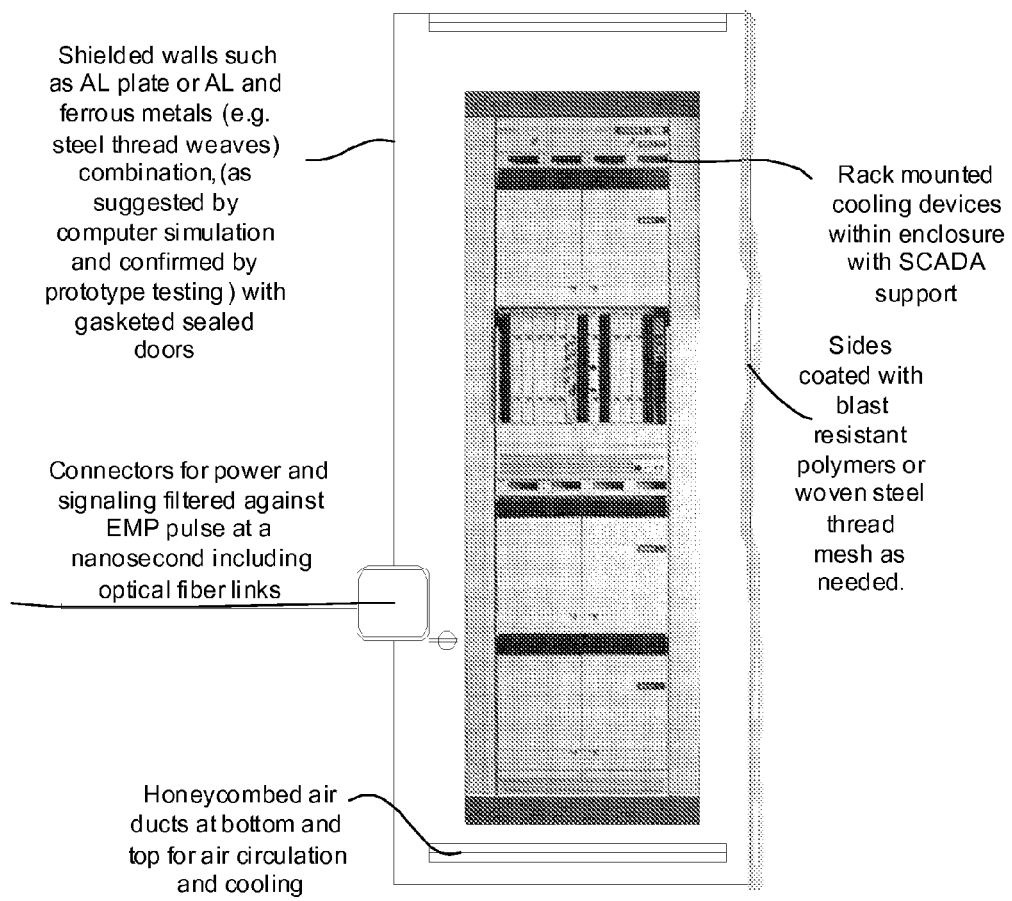
FIG. 2 shows a front elevational view of a shielded rack with SCADA, RFID/OID, cooling and filtered connections in accordance with an embodiment of the invention.

FIG. 2 shows a shielded rack of computing and communications gear that provides protection while operating. Filtered honeycombed air ducts are provided, and filtered power and communication lines pass through the shield without compromising the protection. SCADA and RFID/OID chips and other devices allow for confirmation of test results, controls and maintenance information. Maintenance racks that require opening of the doors can be provided in shielded rooms.

Figure 3:
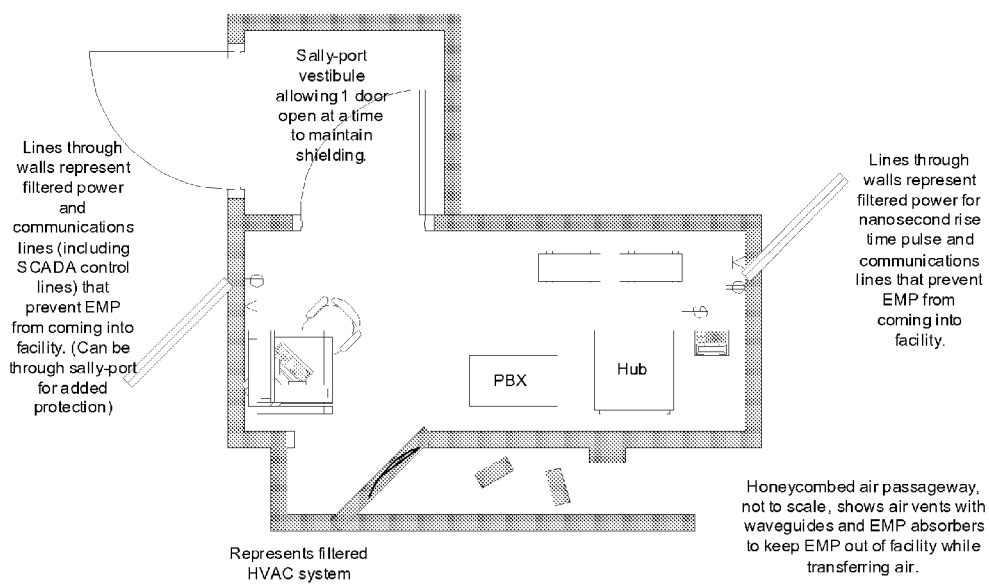
FIG. 3 shows a plan view of a pulse shielded universal room in accordance with an embodiment of the invention.

The enclosures and rooms for working equipment could include anterooms or vestibules that would provide the equivalent of a sally-port ensuring that egress into the shielded working area does not compromise the shielded equipment since one shielded doorway will always be shut, with the doors preferably at right angles to each other. See, e.g., FIG. 3. As in the containers, each of the walls may be comprised of layered aluminum plates with steel thread weaves therebetween, with welded seams between sections of the layers needed for long runs of the shielding material.

Figure 4:
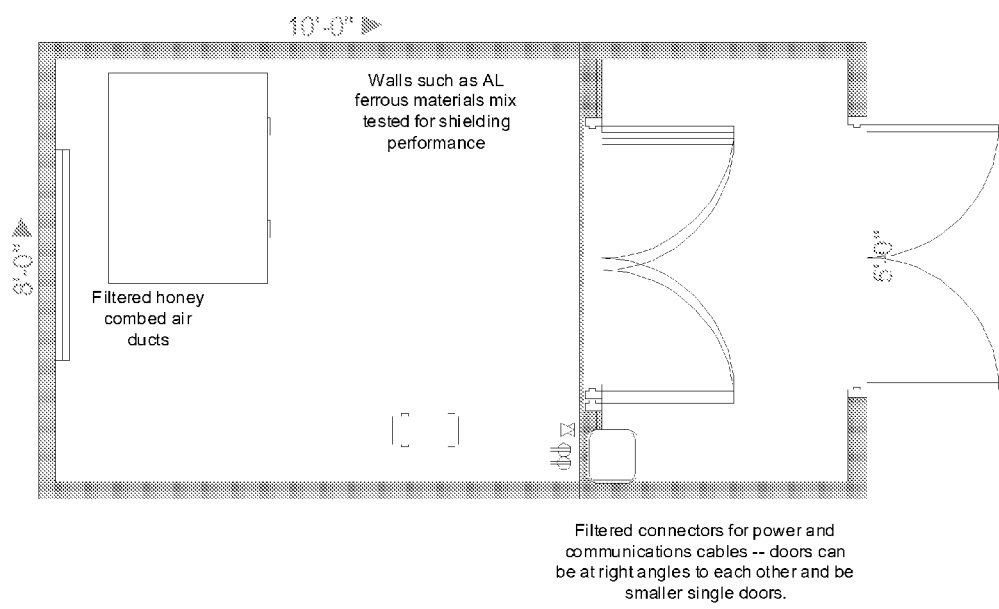
FIG. 4 shows a plan view of an EMP shielded vehicle with vestibule in accordance with an embodiment of the invention.
Figure 5:
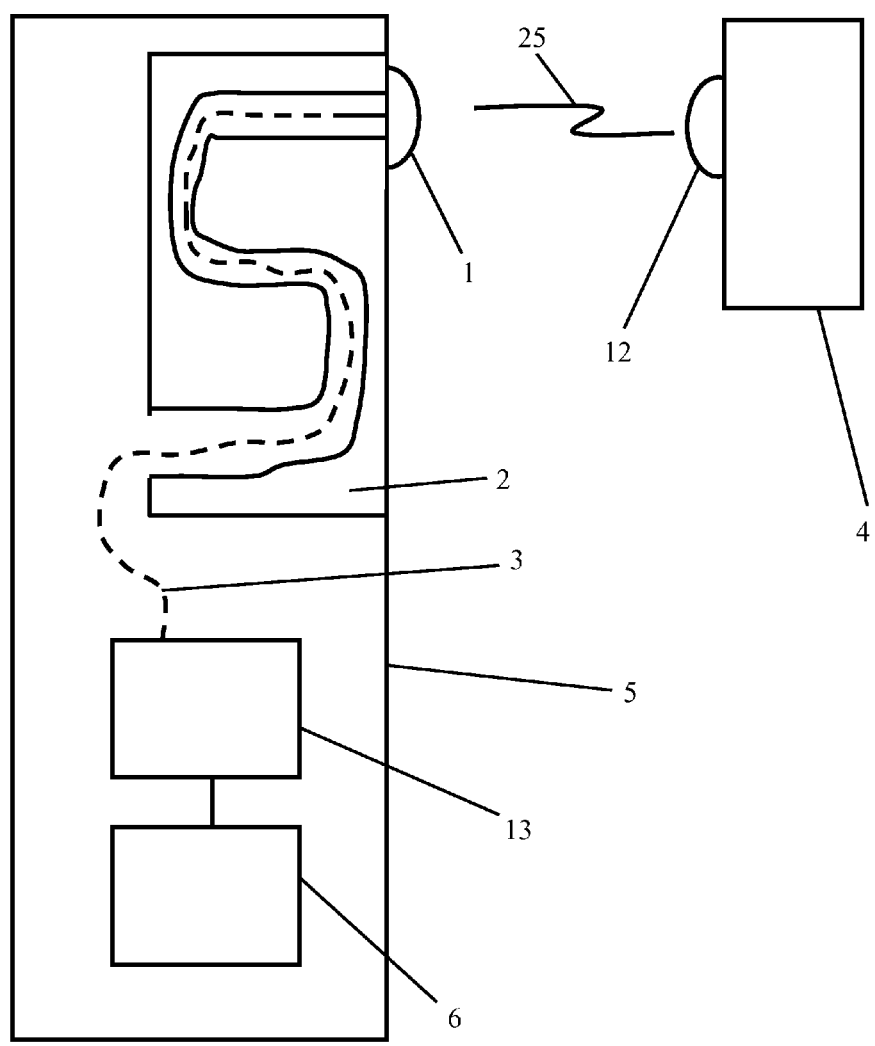
FIGS. 5-9 show optical ID sensor embodiments of the invention.
Figure 6:
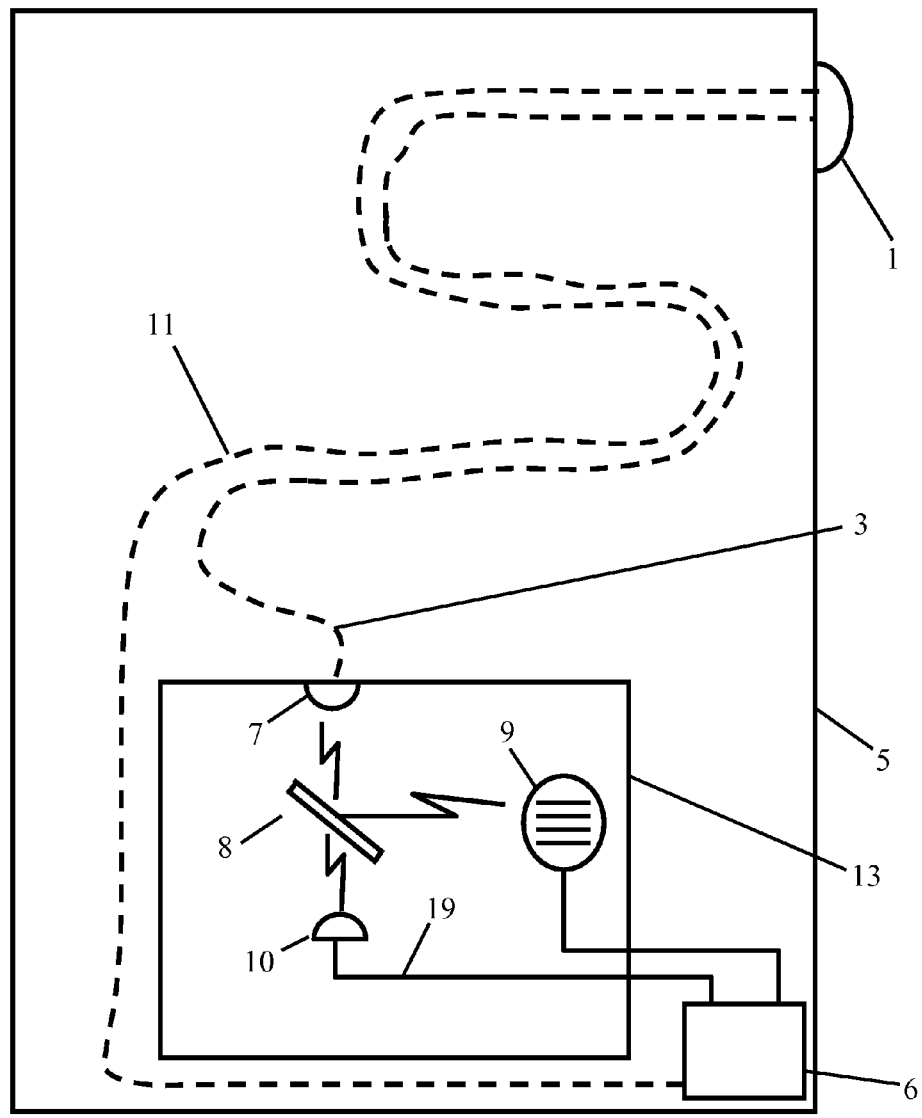
Figure 7:
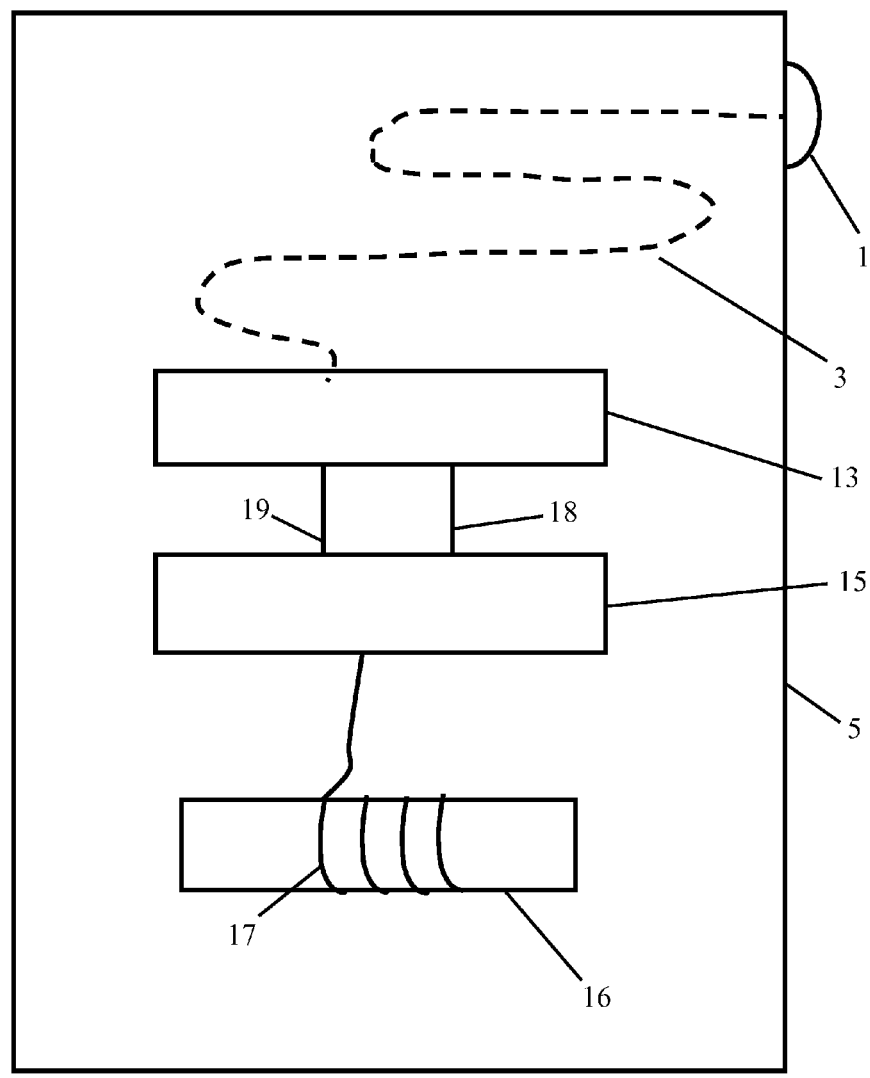
Figure 8:
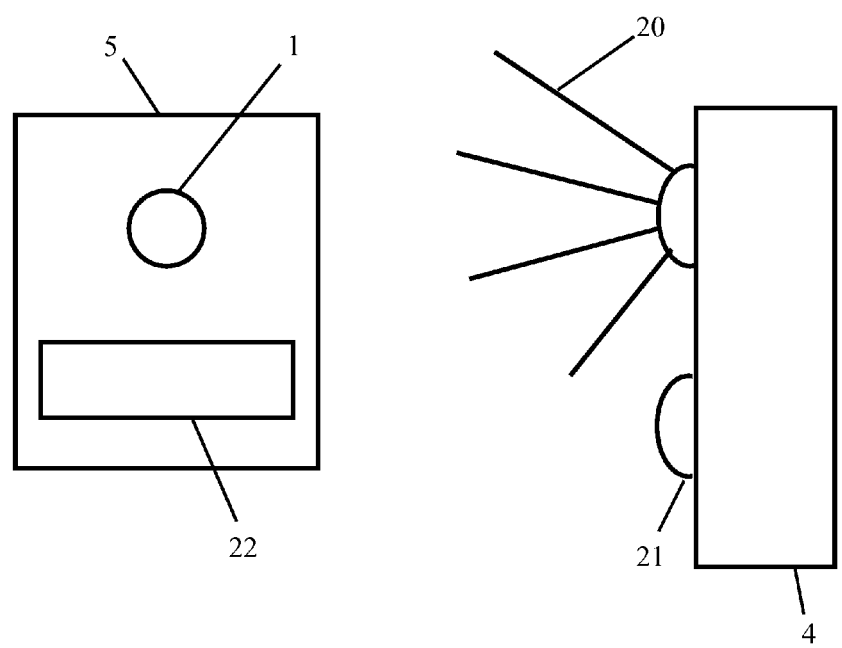
Figure 9:
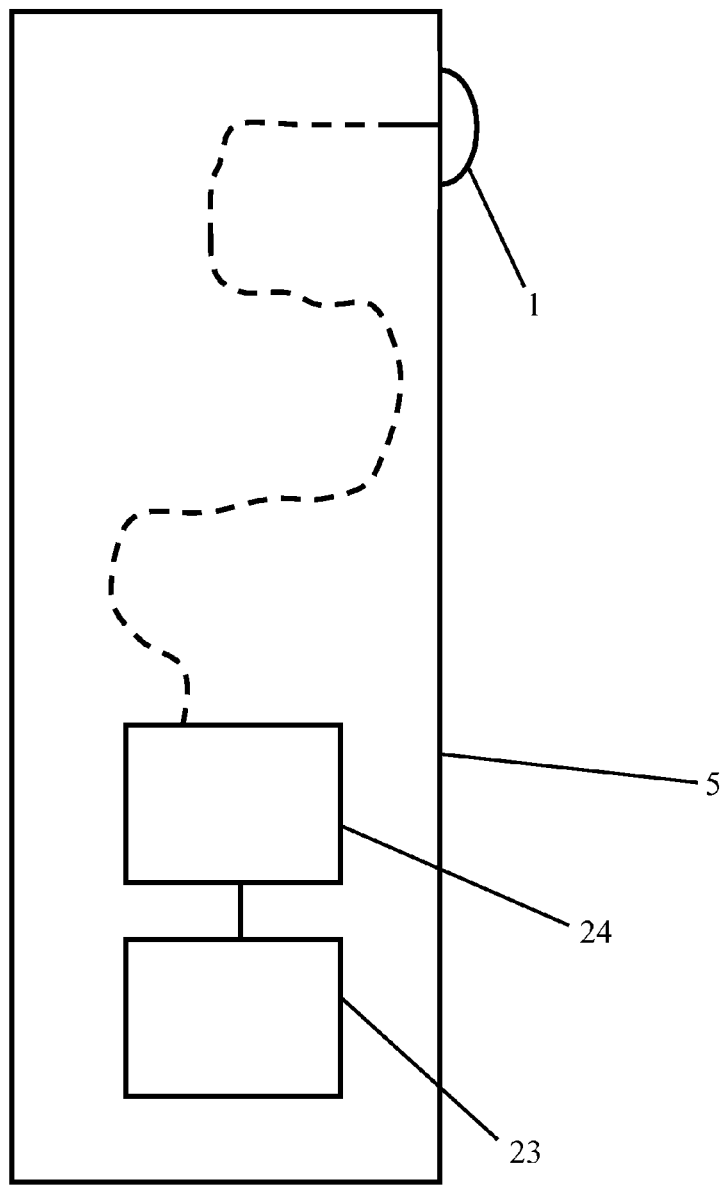

FIG. 4 illustrates how shielded rooms can be used on a vehicle, demonstrating access with a vestibule. This is possible since the invention can reduce the weight of a shield by more than half so that the vehicles would be lighter weight, need less carrying capacity and fuel.

Similarly, any conducting wires for power or communications that come through the shield can be filtered for pulses with rise times as fast as a nanosecond. Power line filters can be provided prior to the sally-port entrance for further protection. A non-conducting fiber optic line can be run through the wave guide. Any small device or chip level connectivity can be further protected by means known to those skilled in the art, including the use of nanotechnology such as Ovshinsky effect materials including selenium and tellurium in which the resistance of the material drops rapidly when a specific voltage is applied across it thus producing a break in the conducting path of an integrated circuit element. Airways can be similarly protected through the use of honeycombed airways and pathways that are angled, turned and protected with metal inserts acting as waveguides that will reflect and absorb electromagnetic pulse enabling air flow while shielding the equipment from the electromagnetic pulse.

Specific connections to optical identification and SCADA devices can be protected by converting signals to optical signals and brought into the shielded rooms or containers through optical fibers, as discussed in further detail below. See FIGS. 5 through 9, which illustrate embodiments of optical ID and SCADA devices.

The present invention includes one or more sensor devices that detect EMP and record the level of EMP signals impinging on the sensor. Sensors are attached to the outside and inside of tested enclosures prior to testing. Once testing is accomplished, the sensors report the level of EMP outside and inside. This allows determination of the performance of the enclosure.

In certain embodiments, the sensor is a very low cost passive device. Many sensors can be placed on a single enclosure, thereby providing detection of an EMP regardless of its direction. See FIGS. 10 through 17, which illustrate embodiments of EMP sensors.

The specific designs of the total system of EMI/EMP shielding can be simulated in advance in order to maximize the value of the shielding technique and tested after the fact using industry standard testing methodology reflecting the size and complexity of the container or room to be shielded.

Similarly, the shielded container, rack or room can also be ruggedized to protect against shock and other environmental hazards as required by the application.

The present invention provides an integrated approach to shielding systems in such a way as to provide universally applicable shielding systems for a combination of uses. Such uses include storage, transportation, and usage for equipment that would work in a rack or cabinet, or a universal shielded pod or room that could also be combined with other pods or rooms to make a larger shielded room or data or communications center environment.

The system can provide pre-tested shielded environments that can meet worst-case scenarios of equipment and staff demand so that cost-effective shielding can be mass produced and deployed quickly. This requires integrated shielding systems that take into account potential applications that work around weight, power and cooling issues while providing testing data that would provide users the confidence of the capability of the universal shielding with the least amount of customized product and work.

Alternative combinations of shielding materials are provided that reduce weight and cost. The invention can separately analyze and account for the electrical fields and magnetic field properties of different materials under electromagnetic interference and then assessing various combinations. The best combination of materials can be used to produce the lightest weight and most cost effective combination of shielding instead of just one material such as steel which might not provide the ideal combination of electrical and magnetic properties from a weight and cost perspective.

Computer simulation of prospective electromagnetic interference from either natural or manmade sources upon various working environments may be provided, so that prototypes of the best alternatives are then made for the purpose of testing the products in electromagnetic interference environments to prove the proposed designs and prototypes.

The present invention can use a combination of 1) far lighter weight metals such as aluminum or copper alloys to handle electrical fields with 2) ferrous metal foils, threads, nanostrands, or impregnated polymer coatings to handle magnetic fields along with additional materials as appropriate to make up for the lack of strength of heavier single metal shields made from material such as steel, 3) test chips such as RFID (and their radio frequency emitters) and, when necessary, SCADA chips or devices to demonstrate the tested or simulated capabilities of the shielding, and 4) SCADA controlled environmental factors such as heating, cooling and moisture. Alternatives to RFID chips include optical ID chips and optical SCADA devices, which are described in a further embodiment of the invention below. The properties of the lighter metal such as aluminum also provide benefits as a heat sync along with various methods to cool the system though encased in a shielded environment. These enclosures or rooms could also include test chips which would demonstrate electromagnetic interference on the outside and inside of the shield. This method and procedures of combining these capabilities represents a novel approach to the problem of EMP shielding without which widespread deployment will not be possible.

Shielding material may include any of a number of known conductive metals such as highly-conductive AA3003 and AA1100 grade seam welded aluminum sheets or plates of various thicknesses such as 0.040 inches to as much as ¼-inch thick for optimum performance; or, alternating layers of ferromagnetic shielding materials that significantly enhance the HEMP shielding response especially to highly destructive magnetic field pulses. Such ferromagnetic materials may include non-oriented and oriented silicon-iron steel sheets (known as grades M-6 to M-47), low-carbon steel sheets (ultra low carbon and grades 1006) and more esoteric shielding materials composed of cobalt-iron (known as MET-GLAS) paper-thin shielding film or thin threads of higher carbon steel or other ferrous metals weaved to create additional Faraday Cage effects especially with magnetic field properties while varied in cases for strengthening effects. A sandwiched shield (aluminum 0.040"—steel 0.050"—aluminum 0.040") may provide the best shielding performance in many applications. Shields with variations in thickness of the outer layer of aluminum are also good performers; a triplet (insulated) aluminum shield also provides good performance.

The thin brass coated steel threaded cables (composed of multiple threads totaling a width of approximately 0.040 in) laid side by side (at roughly 20-23 woven strands per inch) and fixed to a backing can have the face of the steel threads laid against another layer run at right angles to the other threads to it so that the connections between the threads can be increased for the maximum amount of conductivity for both the magnetic and electronic shielding effects. The conductivity has been shown to be significantly enhanced either with solder threads laid between the layers of steel threads facing each other. Conductivity could also be enhanced by applying a layer of conductive foil, such as copper or a met-glass solder foil. Following the steps outlined in this invention, one such simulated combination of thin aluminum sheets and a thin cross weave of steel threads provided a combined magnetic field shield many times more effective than either of the layers alone.

The layers of steel threaded cables provide roughly ten times the tensile strength of steel sheets and the crossed layers of the threaded cables provide protection against projectiles and blast.

The electric fields will be effectively maintained across the shielded room by welding any seams required by the manufacturing process (as opposed to bolting plates together). Depending on the need for conducting or insulating heat through the successive layers of metallic materials, the layers of the nonferrous and ferrous materials can be in direct contact with each other or, separated by insulating materials, including fiber glass in which the steel weaves can be situated.

Additional use of nanotechnology such as nanostrands of shielding material and special composites may also be used for portions of the shield. This may include the use of viruses and other organic materials that can be manufactured, arranged and manipulated to absorb the exact metallic formulation in any given layer of material to meet the requirement of the environment that is simulated, prototyped and then tested.

Some of these systems can be used merely to store and transport equipment in a safe manner. Other systems provide protection for equipment while being used under power considering power lines, communication lines and honeycombed heat dissipation ducts that will penetrate the shields. Other systems in the form of rooms provide protection for users and the equipment. Wires and conduits that could act as antennae can be properly filtered in order to eliminate any magnetic or electrical penetration. The protective methods in certain embodiments assume a broadband array of electromagnetic interference and thus provides protection from the widest array of potential threats. The invention can provide significant value by meeting the military spec range of frequency values known to be of concern. In particular, with reference to MIL-STD-188-125, frequencies should be simulated from 1000 Hz to 1 GHz to establish that shields diminish a field hitting the outside of the shield by 100 decibels (dB) by the time the field is measured at the inside of the shield.

In addition to analyzing and simulating the environment to be protected, the environment in which the electronics equipment will be protected can be designed in such a way to minimize required shielding by minimizing the number and type of conductors penetrating the shielded areas. One primary means to do this is to first convert power from alternating current to direct current so that only direct current lines need to be filtered, thus reducing the cost of the filtering and the type and amount of electromagnetic interference.

Communications lines can also be converted to fiber optic communications to eliminate lines that use conductors. Examples will be shown in the conversion of RFID to optical ID chips.

Other critical infrastructure that can be protected by these means are the various elements comprising power substations and power transformers. For example, power transformers have conducting cables bringing power into and out of the coils that are used to transform the power. These coils are comprised of smaller wound coils that are insulated from each other in order to minimize wasted power and eddy currents within the coil itself since power will flow in the paths with least resistance. However, the amount of power introduced into these coils from the lines leading in and out of them could destroy the protective insulators and minimize the effectiveness or damage the coil portion of the transformer. More susceptible are the electronic controls of the transformer, especially those made from integrated circuits.

Using these embodiments, the conductors bringing power into the transformer coils can be filtered while the electronics of the transformer and power sub station equipment can be housed in the alternative materials shielding, using the heat sync or wave guide air filters to maintain cooling. The SCADA chips can also be protected within the shielded areas sending information and alarms back to network and power control rooms and personnel through fiber optic connections.

Fiber optic lines can also be used to relay information through the shield from test and monitoring chips immune to electromagnetic interference, namely, optical identification chips. A further description of the invention regarding the use of optical ID and SCADA chips is as follows.

One of the devices that is at risk of EMP's destructive power is the radio frequency based identification (RFID) chips used for tagging shipments, animals and various other applications and can be used to test the EMP shielded environment. The advantage of RFID technology is being able to monitor devices without having to make physical or visible contact with the tracked item. In the event of a strong EMP, these RFID devices experience unwanted internal electrical surges that destroy the device's circuitry, disabling its ability to function as intended. RFID devices can be protected from EMP through the use of suitable shielding.

Surrounding the device with EMP protective shielding can prevent the destructive effects of EMP, but the same shielding renders the device inoperative. That is, the shielding prevents external communications with the device via radio waves. Furthermore, EMP shielded racks or rooms would be enhanced by having SCADA capabilities both within and without the shielded environment. Having an EMP immune device to facilitate communications between a user on the outside of a particular EMP shielded facility and users or equipment within a particular EMP shielded facility would be very helpful. A device that is immune to EMP and can provide the monitoring capability desired does not exist in the market.

RFID chips typically do not contain batteries or any other type of internal power source. They must be energized by some external means. Illuminating an RFID with RF energy is a common means to activate an RFID chip's internal circuitry. However, EMP shielding that blocks an EMP also blocks the RF power signal, preventing the RFID from powering up.

Exemplary steps for the development of a shielded container or room include:

Step 1, Determine maximum number of devices within a container including communications, power and heat dissipation requirements. Heat requirements can include formulas that calculate air movement and temperature for people and equipment. The formula for equipment used is: Air quantity (Cubic Feet per Minute, or "CFM") determined by: the Wattage of the equipment; entering air temperature; and the heat rise as the air goes through the equipment. Wattage is converted to heat at the rate of 3.4 BTU per watt. (BTU=watts× 3.4). Heat rise is the temperature differential (TD) between the air entering and the air leaving the equipment. The formula for air quantity is:

$CFM = BTU/TD \times 10.08$

Step 2. Simulate the predicted electromagnetic interference (EMI) effect of the range of electromagnetic interference from sources such as extreme solar flares, high altitude electromagnetic pulse (as much as 200,000 volts/meter with the first of three pulses as fast as a nanosecond), directed energy weapons, or interference from other emitting equipment. through both the electrical and the magnetic fields on (2a) each type of material of each shielded container along with filtered lines and air vents so that the proper amount of electrical shielding and magnetic shielding can be separately accounted for in their respective and different shielding materials and filtering methods. Simulate the benefit of (2b) the combination of multiple layers of shielding of different materials and thicknesses in order to provide the best shielding protection along with the other environmental protection that a given environment may need at appropriate cost levels. Simulation can be done by using software and models such as the Ansoft Maxwell® 3-dimensional field simulation software, preferably using both time-transient and single frequency numerical finite element analysis.

Step 3. Deploy shielding material capable of protecting against the same range of electromagnetic interference as described in step 2. Electrical field shielding may include aluminum plates welded when plates are needed to be joined and the appropriate amount of magnetic shielding from ferrous foils, steel threads or other materials with magnetic properties layered in between the aluminum sheets or plates. If a room in which people work, provide protected doorways, preferably shielded ante-rooms or vestibules so that a shielded door is closed at all times.

Step 4 Determine structural needs for surfaces needing to fasten equipment so that surface shields are not compromised. For example, sandwiched layers of AL and steel thread may be embedded in a layer of protective materials such as fiberglass. These materials may be combined to make flooring materials for mobile rooms or data centers in such a way that equipment and racks can be connected or bolted into materials that protect the shields from being penetrated, crushed, or otherwise compromised.

Step 5. Add polymer coatings to exposed sides of the container as needed for blast, corrosive or other environmental protection as needed.

Step 6: Minimize the power lines coming into the shielded area by converting alternating current sources into one or more direct current sources outside of the main shielded area thus reducing the number of lines needing to be filtered and reducing the extra power needed to be converted from alternating current to direct current and reducing the heat generated by that conversion process so that cooling requirements can be minimized Step 7: Minimize the number of conducting communications lines by converting as many communications lines to fiber optics outside of the main shielded area so that fewer conducted lines would need to be filtered and that the overall impact to the shields would be reduced.

Step 8. Provide filters for lines coming through the shields. Provide filtering at the outside of the shields for incoming power lines to be conditioned and converted before or within the anteroom prior to entry to the protected interior room so that fast pulses as quickly as a nanosecond can be filtered.

Step 9. Provide filtered honeycombed air passage-ways with wave guides and pieces of material used to reflect and absorb EMP waves that would otherwise pass through air passageways.

Step 10. Place EMP measuring devices, such as RFID chips, throughout the interior of filtered lines and spaces to provide preliminary and on-going test results to prospective users of the system. RFID information (especially in the FM range) that is broadcast from the outside of the shielded room should not be received by sensors on the inside of the room unless the shield has been compromised. RFID information that is sent through protected channels should be receivable by the sensors on the inside of the room. In this way, ongoing testing can be conducted to at least partially demonstrate the continued viability of the shield.

Step 11. Place SCADA devices or chips with appropriate software or firmware, throughout the enclosures or rooms to monitor and control environmental elements such as internal temperature, EMI, and other effects of environmental contamination (that could include chemical, biological and radiological contamination) to maximize performance though shielded enclosures or rooms.

Step 12. Test the shielded containers and rooms and place test data within the RFID chips and or SCADA chips or devices along with information demonstrating proper use and maintenance including business rules for the orderly shutdown or use of equipment as the environment requires.

Step 13. Build in external testing capabilities such as FM signal generators to provide at least minimal on-going testing to verify shielding effectiveness by receivers placed on the inside of the shields. If the FM signals are received on the inside of the shield, that would provide an indication that the shield has been compromised and breached. Those signals generate alarms back to the system administrators within or outside of the shielded room.

Example of Simulation Steps Providing Novel Combination of Materials

An example of the simulation steps mentioned above on a novel combination of materials for shielding with known different electromagnetic characteristics provided the following results.

Using the Ansoft Maxwell® 3-D Field Simulation Software on the combination of thin (0.040 in) aluminum alloy sheets with a weave of brass coated high-carbon steel threads (made of multiple steel strands each) sandwiched in between the aluminum sheet layers, the magnetic field properties of the sandwiched materials were simulated to be many times more effective than single thicker materials alone. This will provide superior electromagnetic protection at less than half the weight of alternative systems using steel only. The weave of high carbon steel threads will provide tensile strength far surpassing comparably thick steel sheets. Using the results of that simulation, prototyping and testing of a shielded room can be done to validate specific manufacturing techniques most effective in producing mass produced quantities of these rooms.

The Sub-Steps of Deploying Optical ID and SCADA Chips

Industry-standard EMP shielding is used to shield devices, buildings, vehicles, and other forms of electronic containment, and filters are used to allow passage of signals and power into and out of an EMP protected area. For example, incoming power lines are filtered to reject an EMP from entering the protected space. Similar filtration is required for the passage of communications signals into and out of the protected space. EMP filtration is also used to allow passage of coolant for continuous cooling or heating of the protected space.

One of the means for allowing signals to enter and exit is through the use of fiber optics cable. Optical fiber does not transmit radio waves and therefore does not provide a conduit for EMP to enter a protected area as long as it passes through a wave guide protected passageway.

With reference to FIGS. 5 through 9, the embodiments using optical ID devices provide for the passage of signals using optical fiber 3. Optical energy is emitted by device 4 and passes through space as a beam 25 to device 5. An optical antenna, or wide angle lens 1, is used to connect signals to and from devices external to the protected area. This enables communications with an ID device 6 inside the EMP protected area 5 from outside the protected space. The protected space 5 could be a cargo carrier or just the devices of the present invention, in which case the device 5 would nominally be mounted on the outside of another items being tracked. The optical fiber 3 interconnects the lens antenna 1 with the optical identification (OID) device 6 inside the EMP protected space 5 via interface device 13. Fiber 3 is passed through an EMP filter such as the "S" shaped tunnel 2. The same optical energy used to power the device 6 is modulated in order to carry signals to the protected OID device 6. For example, to interrogate an OID 6, optical energy is aimed at the lens antenna 1. Interface device 13 converts photonic energy into electrical power. Photons enter the protected space via the lens antenna and optical fiber 3 and are detected by a solar cell like device 9 inside the protected space. The device 9 converts the photons to electricity. This electricity is then used to power the OID device 6. The optical energy entering space 5 via fiber 3 is divided by a partially reflecting mirror 8. Most of the energy may be allowed to pass through 8 to reach the photovoltaic converter 9. The balance of the photons are directed by mirror 8 to lens 10, which connects the modulated photon signal to device 6.

Alternative devices can be used in the place of splitting mirror 8 such as prisms. This can be achieved using different optical wavelengths for the power and communications signals.

Once device 6 receives electrical energy from device 9 and is powered up, the OID device 6 detects and demodulates incoming optical signals via lens 10 to receive the desired information. In the reverse direction from the OID to the external system interrogating the device, the OID emits modulated optical signals that travel back out the optical cable, through the external lens 1 to the external interrogating device 4. This reverse path can be implemented using the same optical path as the incoming photons or a separate fiber path 11. Furthermore, this alternative path can be equipped with a separate external lens rather than passing the signal through lens 1.

To communicate as noted typically requires use of an external device 4. This external device can be EMP protected itself. External device 4 uses lens-antenna 12 to send and receive signals and to emit optical power used to power the OID 6.

Many types of RFID devices are known, and the present invention can augment their use. To do so, an optical/RF converter 15 is used. The optical/RF converter 15 is located inside the protected space and is connected to the external lens antenna 3 via the fiber 3. The converter 15 is powered by the incoming optical energy and demodulates that same optical input to extract desired information. The modulated optical signal is connected to converter 15 via optical fiber 19. The electrical power derived from the incoming photonic energy is sent to 15 via electrical wiring 18. Using the power derived from the incoming optical energy, the optical/RF converter 15 generates an RF signal, modulating it with information demodulated from the incoming optical signal. The resulting RF signal is then coupled to the existing RFID chip 16 via RF antenna 17. This antenna is used to couple signals into RFID device 16 and to receive signal emitted by the device 16.

In order to transmit RF signals generated by an RFID device 16 to an external device 4, the RF signal is detected by the optical/RF converter 15, which generates a corresponding modulated optical signal that is then passed to outside the protected space via the optical cable and lens antenna. That is, converter 15 contains an RF receiver that converts the modulation on the RF signal received from device 16 to an optical signal that is send to external device 4 via a fiber and lens such as 3 and 1 respectively.

The RF coupling of the RFID device 16 and the converter 15 is done by placing them in close proximity to each other. This is indicated by antenna 17 being wrapped around device 16. This ensures effective transfer of RF power to the RFID device 16. The amount of RF power that is coupled from converter 15 to device 16 must be sufficient to power device 16 as well as carry signal information to device 16.

The intensity of the optical power required to power the multiple forms of this invention requires more energy than is required to communicate alone. Coupling enough optical energy into lens 1 requires taking into account the size of the lens aperture. This is typically 15 degrees of beam width versus the nearly omni-directional nature of most RFID devices. To ensure suitable coupling occurs, optical scanning can be used to determine the location of, or direction to, an OID. Device 4 emits multiple beams 20 sequentially in various directions. For example, device 4 could be located along a railroad track scanning passing cargo. The scanning device 4 for reflections of the beam(s) 20 it emits. The monitoring can be done using a second optical lens 21. When the scan passes over the area where an OID lens antenna 1 is located, a passive reflector 22 bounces back some of the optical energy in beam 20. This is detected by the scanning device as a potential location of an OID. The scanning device 4 can then dwell on the spot long enough to effect communications with the OID.

False reflections can occur from a number of surfaces unrelated to the use of OIDs. Therefore, the scanning device can use an initiate protocol at the start of the dwell period. The OID detects an optical signal and sends back a response. If the scanning device does not detect a response, it assumes the reflection is false and continues to scan.

To assist in locating an OID during a scan, two independent optical frequencies can be emitted by the scanning device. The external surface of the OID's lens antenna or surrounding material is coated with a material that reflects one of the two optical frequencies and not the other. The scanning devices monitor for the reflections of the one frequency and not the other to determine the presence of an OID. This reduces the dependency of the scanning device on the functioning of the OID to detect the OID's presence.

The intense optical power required to power the OID means addressing the issue of eye safety. For this reason, infrared energy is preferred. The scanning signal does not have to be as intense, however. Therefore, visible signals can be used e.g. green and red. This means visible reflection colors can be used, which make the presence of the OID more easily located. Alternatively, ultraviolet phonic signals can be used in scanning via beams 20. The reflector 22 would be a reflector that reflects UV. In this respect, common objects do not reflect UV effectively. By using UV reflectors 22, false reflections are less likely.

The geometry of the passive reflections can be selected to improve the desired detectability of suitable reflections. Also, various other forms of passive barcode reading can be used to detect the presence of an OID.

An RFID normally communicates omnidirectionally or nearly so. An OID's directionality is more constrained as governed by physical laws related to frequency and the need for line-of-sight to communicate. The field of view for an optical system is affected by the angular aperture of a fiber optic cable ends. Therefore, multiple lenses and fiber cables can be used to enhance the field of view. The ends of fibers can also we formed to create lens geometries for gathering photons. Using fiber material with a graded index can also ensure increased capture of the photons. Many of the optical fiber characteristics such, as diameter, that have a profound impact on long haul transmission of data over optical cable do not apply in the case of an OID where the distances are short and the data rate requirements are far less than typical telecommunications links.

An issue of concern, particularly when secondarily powering an RFID, is the amount of optical power that can be delivered to the OID. This is a function of the size of the OID's lens, its efficiency over the design field of view, the optical output power and beam width of the scanning device, the distance between the OID and the scanner as well as the scanner's output antenna or lens. To minimize the length of the fiber cable and therefore transmission losses, the OID electronics can be housed in its own EMP protection. When combining the OID with an RFID chip as noted above, the RFID and OID's electronics can all be included within the one EMP shielding. The assembly can then be attached to the outside of the item being tracked. However, in the case of using an EMP protected OID, the information received or created can be sent through a fiber cable that connects to a receiver within another EMP protected environment for processing. Since the fiber cable is not a conductor, it is less difficult and less expensive to allow that fiber line into the other EMP shielded environment since the an electromagnetic pulse would not be conducted into that other EMP shielded environment and filtering requirements would be minimized.

In the direction from the OID to the scanner, the OID is not aware of what direction the scanner is located. When the OID emits optical power, very little of it may exit the lens antenna in the desired direction. The ability of the scanner to receive and suitably demodulate information coming from the OID will therefore be critically dependent on the distance between the two devices. This directly impacts the data rate that the link between the devices can support, as does random light, e.g. daylight, in the vicinity. To extend the operating range, or distance, that the devices can support, the OID initiates dialog with the scanner at a low data rate. The two devices then handshake and increase the data rate as a function of the optical link's signal performance.

The effective angle of view by device 5 via its lens can be enhanced by using multiple lens oriented in contiguous directions.

Another embodiment of the invention uses an internal battery 23 to power the OID. The OID may contain existing RFID technology 16 or simply use electronics based device 6 with optical interfaces shown in device 13. Using the battery 23 would reduce or obviate the need for power via incoming optical energy. The battery would be sized for the service life of the OID. The useful life of battery 23 can be enhanced by operating the OID in a low power consumption mode until activated by an external optical signal. The battery 23 can also be used in an OID as a supplement or backup to the power derived from the external optical energy by device 13. This would also assist the OID to function when the incoming optical energy is not sufficient to power the OID, but is strong enough to effect communications.

Implementation of EMP Sensors

The use of EMP sensor chips that provide visual inspection capabilities will now be described in detail. EMP sensor chips detect EMP and record the level of EMP signals impinging on the sensor. Sensors are attached to the outside and inside of tested enclosures prior to testing. Once testing is accomplished, the sensors report the level of EMP outside and inside. This allows determination of the performance of the enclosure.

Figure 10:
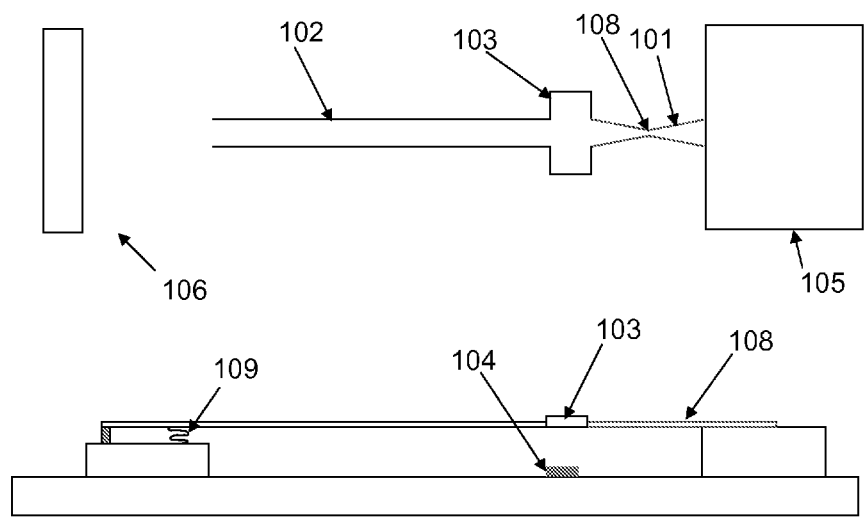
FIGS. 10-17 show EMP sensor embodiments of the invention.

The sensor is a very low cost passive device. Many sensors can be placed on a single enclosure. This ensures detection of an EMP regardless of its direction. As is shown in FIG. 10, there is a conductive fuse-antenna 101 made of a resistive material. When an EMP arrives at this fuse-antenna, an electric current is induced. The electrical circuit carrying the current includes conductive mounts 105 and 106 as well as conductive base 107. The fuse-antenna 101 is constructed with a narrowing at point 108. When electrical current is induced by the EMP, the current along fuse-antenna 101 will be of sufficient magnitude to heat the resistive material at point 108 to cause it to melt. That is, the size of the narrowed material at point 108 is so small as to "fuse" when a small current is induced the EMP.

Figure 11:
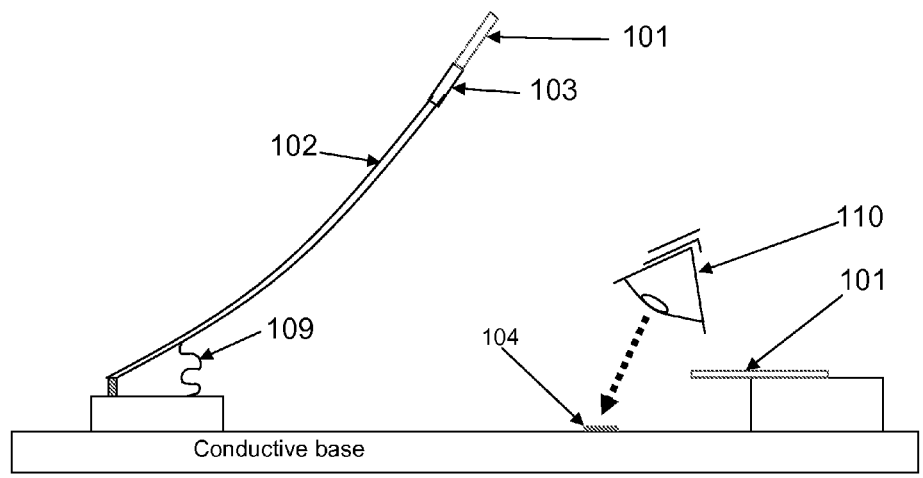

As shown in FIG. 11, when the fuse-antenna 101 fuses, sensor arm 102 is raised by pressure from spring 109. This raises the wide portion 3 of sensor arm 2 whereby observer 110 is able to see a visible marker 104. This allows the observer to determine the fuse-antenna 101 and point 108 has fused, indicating the experience of an EMP.

Figure 12:
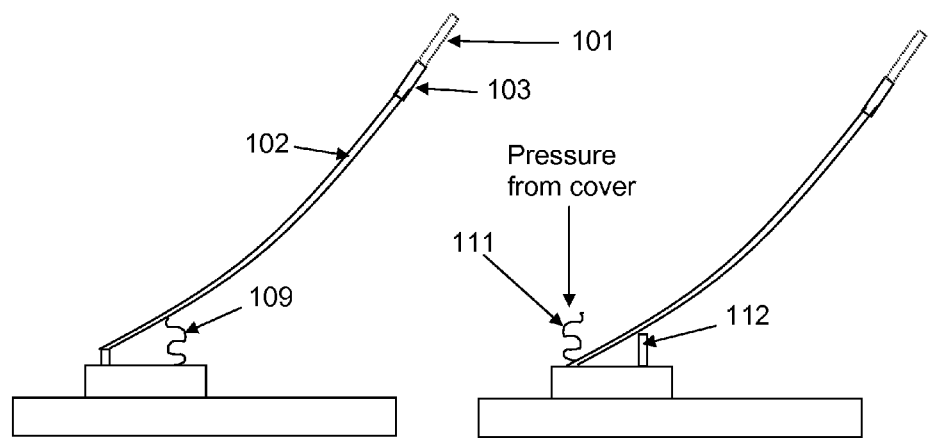

In FIG. 12 an alternative means of spring loading the fuse-antenna 101 is shown where pressure is applied via spring 111 from above the end of the sensor arm 102 cantilevered on standoff 112. There are many other means of spring loading the sensor arm.

Figure 13:
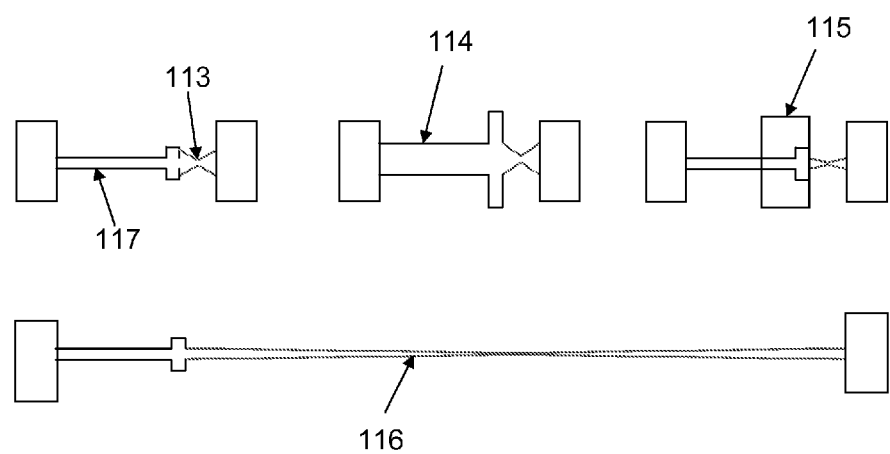

The amount of current induced in the sensor arm 101 depends on the strength of the EMP and the length of the sensor fuse-antenna. In this respect the sensitivity to EMP can be modified by using a thicker fuse point 108 such as point 113 in FIG. 13. In FIG. 13, also shown is a wide spring 114 which has a different effective antenna performance than a thin sensor arm 117. The length of the fuse-antenna 116 can be elongated to change the sensitivity to an EMP. In FIG. 13 the visible blocker 115 is shown enlarged which allows use of a larger visible spot 104 in FIG. 12.

Figure 14:
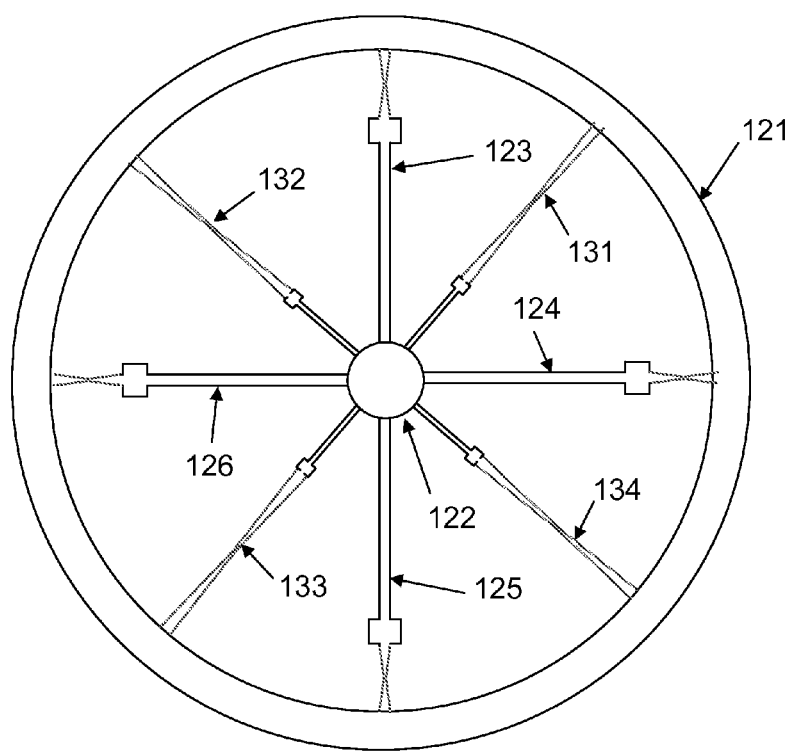

Sensitivity to an EMP is also a function of fuse-antenna orientation. FIG. 14 shows an area of fuse-antennas 123 through 134. These fuse-antennas are all electrically connected to conductive mounts 121 and 122. The various orientation of the fuse-antennas 123 through 134 support detection of EMPs from various directions.

Fuse-antennas 123 through 126 are shown with longer sensor arms 131 through 134. This is an indication that multiple shape and size fuse-antennas can be mounted in the same sensor device.

Figure 15:
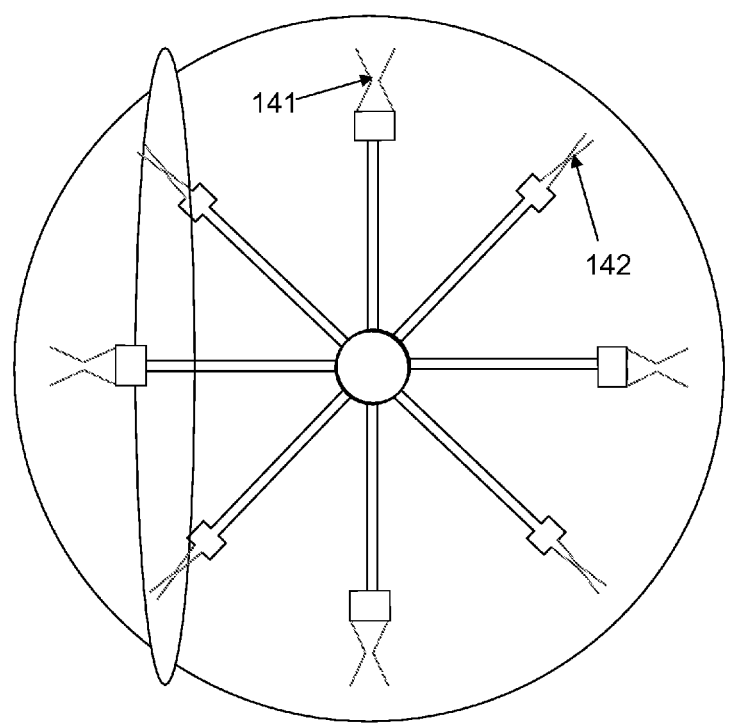

In FIG. 15 fuse points 141 and 42 are shown with different thicknesses. This allows for fusing under different EMP induced current levels. This allows for detection of EMPs and simultaneously determining relative strength of the EMPs.

Figure 16:
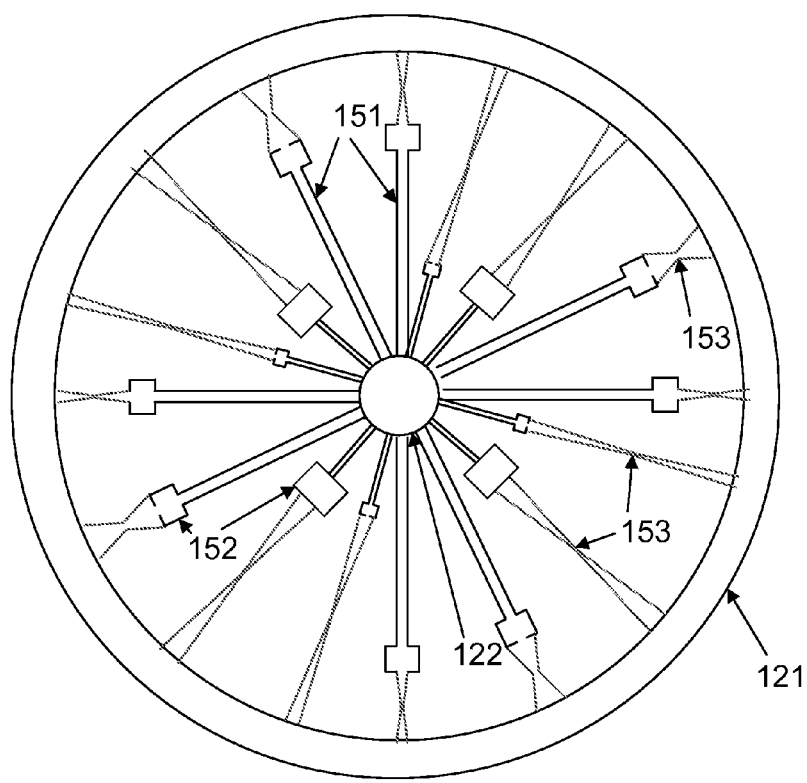

FIG. 16 shows a more complex mixture of different size sensor arms 151, visible block 152 sizes, and fuse points 153 and well as multiple orientations.

Figure 17:
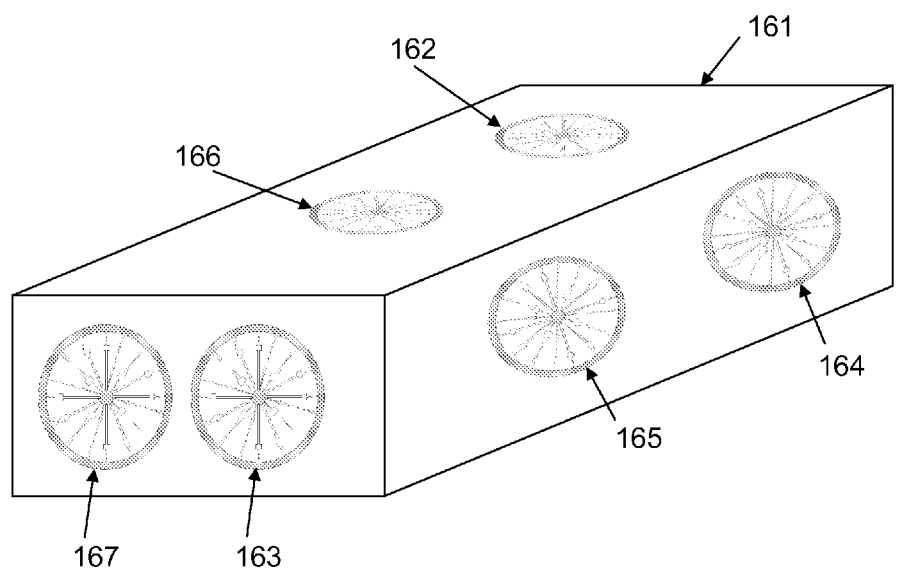

FIG. 17 shows sensor devices 162, 163, and 164 mounted on different sides of EMP enclosure 161. Sensor devices are similarly mounted on the inside of the enclosure 161. The sensor devices 162, 163, and 164 can be used to record the impact of EMPs during production testing of enclosure 161. After this testing, additional sensors 165, 166, and 167 can be applied to the enclosure for future detection of EMPs.

The teachings of U.S. Pat. No. 6,584,183 may be used in combination with the present invention. In particular, the invention of claims 14-21 thereof, which relate to provisioning of data services and the use of secure identifiers, may be combined with the present teachings. The teachings of U.S. Pat. No. 6,788,771 may also be used in combination with the present invention. In particular, the invention of claims 1, 3, 7 and 8 thereof, which relate to using a calling number or identifier to determine the quality level of sponsored services, and using a calling number to provide free security services, may be combined with the present teachings. Each of these two patents illustrate how a sponsor can be contacted to provide either a service or quality of service based on the request of the user. The teachings of U.S. patent application No. 10/934,092 filed Sep. 3, 2004 may further be combined with the present invention. In particular, the invention of claims 7-12 thereof, which relate to methods of operating a telecommunications device or network, detecting a change of personal medical status or environmental status, and using a data center within a network to offer managed services, wherein network users do not need to provide specialty software or hardware at the user's location, may be combined with the present teachings. Each of these three references demonstrate the concept of using the changes within an environment of a person or network element whereby certain actions are taken according to business rules that show which conditions a sponsor is willing to pay and have provisioned a service or quality of service. Based on environmental changes either within or on the outside of the EMP protected room or chamber, those changes can require an increase or decrease of services or require an additional service or shutting one down in order to meet the needs of the people or equipment either in the environment or those depending on them. These services may also include services requiring different levels of security, permissions or quality of service. These two patents and the pending application are each hereby incorporated herein in their entirety.

In accordance with the above disclosure, the invention in certain embodiments provides a monitorable, testable and mass producible EMI/EMP shielding solution for rooms and enclosures that protects critical infrastructure and is lighter weight and less costly than other approaches using single material solutions that are custom built.

While the invention has been particularly shown and described with reference to a preferred embodiment thereof, it will be understood by those skilled in the art that various changes in form and details may be made therein without departing from the spirit and scope of the invention.

The embodiments of the invention in which an exclusive property or privilege is claimed are defined as follows:

1. A method of simulating electromagnetic interference upon a given shielding material and environment, comprising:
    calculating distinct electrical and magnetic fields;
    using the result of said calculation to provide an appropriate electrical field protection separately from magnetic field protection; and,
    re-simulating a plurality of varying combinations of materials, each of said combinations of materials comprising multiple layers of material in different thicknesses, different electrical properties, and different magnetic properties, and wherein said re-simulating step comprises re-simulating with a different number of layers than was simulated in an original simulation step, to maximize the combined electromagnetic effects of the varying combinations of materials and thicknesses;
    wherein said step of calculating distinct electrical and magnetic fields and said step of re-simulating the varying combinations of materials are performed using at least one particular machine, said at least one particular machine comprising a computer.

2. The method of claim 1, further comprising the step of shielding an electronic, power, telecommunications or computing device from electromagnetic interference, comprising the steps of: shielding the equipment on all sides with effective electrical pulse shielding materials and providing effective magnetic shielding by layering ferrous metals such as iron in the form of foils, coatings or steel strands in combination.

3. The method of claim 1, further comprising the simulation of EMP reflection and absorption of the shielding.

4. The method of claim 1, further comprising the step of testing EMP reflection and absorption of the shielding.

5. The method of claim 1, further comprising the embedding of test chips which can demonstrate the degree to which the EMP shielding succeeds in protecting integrated circuits from test pulses.

6. The method of claim 1, further comprising the embedding of SCADA chips or devices capable of monitoring and controlling internal environmental factors in order to maintain functional integrity of the container or room.

7. The method of claim 1, further comprising the testing of the shielded enclosure or room and embedding the test data into the RFID and or SCADA chips or devices.

8. The method of claim 1, further comprising the continual testing of the shielded enclosure while the shielded equipment is working by creating one or more innocuous radio signals on the outside of the shield while measuring whether those signals are penetrating the shield.

9. The method of claim 2, further comprising the step of coating one or more of the exposed surfaces with polymers to add strength and corrosive resistance or to the shield.

10. The method of claim 2, further comprising the step of layering one or more layers of strengthening materials in order to place fasteners that would protect a shielded surface from the piercing or crushing effect of equipment placed on the shielded surface.

11. The method of claim 2, further comprising the step of providing air cooling of the system by convection through the non-coated surfaces.

12. The method of claim 2, further comprising the system of providing cooling of the system by placing liquids against one or more of the surfaces that transfer the heat.

13. The method of claim 2, further comprising the system of providing honeycombed air passageways acting as wave guides that provide shielded pathways for airflow.

14. The method of claim 5, further comprising the monitoring and reporting of those results to a system administrator.

15. The method of claim 5, further comprising the orderly shut-down of equipment inside the shield.

16. The method of claim 5, wherein said test chips comprise radio frequency identification (RFID) chips or optical identification (OID) chips.

* * * * *